United States Patent
Sibbald

(10) Patent No.: US 10,012,071 B2
(45) Date of Patent: Jul. 3, 2018

(54) DIFFERENTIAL METHOD FOR EQUITABLE ALLOCATION OF HYDROCARBON COMPONENT YIELDS USING PHASE BEHAVIOR PROCESS MODELS

(71) Applicant: Laurie Sibbald, Calgary (CA)

(72) Inventor: Laurie Sibbald, Calgary (CA)

(*) Notice: Subject to any disclaimer, the term of this patent is extended or adjusted under 35 U.S.C. 154(b) by 1216 days.

(21) Appl. No.: 13/939,651

(22) Filed: Jul. 11, 2013

(65) Prior Publication Data

US 2015/0019145 A1 Jan. 15, 2015

(51) Int. Cl.
| | |
|---|---|
| G01F 1/00 | (2006.01) |
| G01F 7/00 | (2006.01) |
| E21B 47/10 | (2012.01) |
| E21B 43/14 | (2006.01) |
| E21B 49/00 | (2006.01) |
| G01V 11/00 | (2006.01) |
| G01F 1/84 | (2006.01) |

(52) U.S. Cl.
CPC .............. *E21B 47/10* (2013.01); *E21B 43/14* (2013.01); *E21B 49/00* (2013.01); *E21B 49/008* (2013.01); *G01F 1/8436* (2013.01); *G01V 11/00* (2013.01)

(58) Field of Classification Search
None
See application file for complete search history.

(56) References Cited

U.S. PATENT DOCUMENTS

| | | | | |
|---|---|---|---|---|
| 7,293,471 | B2 * | 11/2007 | Lund Bo | G01F 1/40 73/861.04 |
| 7,373,285 | B2 * | 5/2008 | Webb | G05B 17/02 166/250.15 |
| 7,895,051 | B1 * | 2/2011 | Theriot | G06Q 30/0283 702/6 |
| 7,895,052 | B1 * | 2/2011 | Theriot | G06Q 30/02 166/308.1 |
| 7,895,134 | B2 * | 2/2011 | Theriot | G06Q 30/0283 166/308.1 |
| 8,401,832 | B2 | 3/2013 | Ghorayeb et al. | |
| 8,983,815 | B2 * | 3/2015 | Bleackley | G06F 17/5004 703/6 |
| 2002/0165671 | A1 | 11/2002 | Middya | |
| 2006/0116856 | A1 * | 6/2006 | Webb | G05B 17/02 703/10 |
| 2006/0224369 | A1 * | 10/2006 | Yang | E21B 43/16 703/10 |
| 2009/0032249 | A1 * | 2/2009 | Morales | E21B 43/34 166/250.01 |
| 2009/0150097 | A1 * | 6/2009 | Camilleri | G01P 5/00 702/45 |

(Continued)

OTHER PUBLICATIONS

*Electric Power Group v. Alstom* (Case Attached).*

*Primary Examiner* — Mohamed Charioui
*Assistant Examiner* — Leonard S Liang
(74) *Attorney, Agent, or Firm* — Lewellyn Law, PLLC; Stephen Lewellyn

(57) ABSTRACT

A method for equitable allocation of hydrocarbon component yields which uses the output of process modeling of the hydrocarbon processing system with the individual source streams commingled into a single inlet stream to create a differential value table which can be used to provide the allocation of output product to the individual source streams that are accountable for the individual component yield.

12 Claims, 10 Drawing Sheets

(56) References Cited

U.S. PATENT DOCUMENTS

| | | | |
|---|---|---|---|
| 2009/0198477 A1* | 8/2009 | Benish | E21B 43/00 703/10 |
| 2010/0250468 A1* | 9/2010 | Theriot | G06Q 30/0283 705/413 |
| 2011/0198088 A1* | 8/2011 | Caro | E21B 33/124 166/308.1 |
| 2011/0224835 A1* | 9/2011 | Stenhaug | E21B 37/00 700/282 |
| 2011/0297370 A1* | 12/2011 | Michael | E21B 47/10 166/250.15 |
| 2012/0095733 A1 | 4/2012 | Rossi | |
| 2014/0303949 A1* | 10/2014 | Boneti | 703/6 |

* cited by examiner

| Compound | Existing Inlet Composition (mole fraction) | New Stream Composition (mole fraction) |
|---|---|---|
| NITROGEN | 0.0158 | 0.0097 |
| CARBON DIOXIDE | 0.0049 | 0.0051 |
| HYDROGEN SULFIDE | 0.0000 | 0.0000 |
| HELIUM-4 | 0.0004 | 0.0004 |
| METHANE | 0.8276 | 0.7224 |
| ETHANE | 0.0719 | 0.1166 |
| PROPANE | 0.0393 | 0.0737 |
| ISOBUTANE | 0.0089 | 0.0161 |
| n-BUTANE | 0.0156 | 0.0283 |
| ISOPENTANE | 0.0049 | 0.0088 |
| PENTANE | 0.0047 | 0.0085 |
| HEXANE | 0.0033 | 0.0059 |
| HEPTANE | 0.0015 | 0.0028 |
| OCTANE | 0.0007 | 0.0012 |
| NONANE | 0.0002 | 0.0003 |
| DECANE | 0.0000 | 0.0001 |
| CARBON MONOXIDE | 0.0000 | 0.0000 |
| HYDROGEN | 0.0003 | 0.0001 |

Fig. 2

| Liquid Component | Existing Stream m3 | Liquids With New Production m3 | Additional Liquids with New Stream m3 | Liquids Allocated to New Stream with Standard Method m3 | Liquids Allocation Difference m3 | % |
|---|---|---|---|---|---|---|
| C3 (Propane) | 1,717.2 | 1,876.8 | 159.6 | → 110.4 | -49.2 | -30.8 |
| C4 (Butane) | 2012.9 | 2,164.7 | 151.8 | → 123.1 | -28.7 | -18.9 |
| C5+ (Pentane+) | 1983.0 | 2,110.3 | 127.3 | → 120.0 | -7.3 | -5.7 |

Fig. 3

| Liquid Component | Existing Stream m3 | Liquids With New Production m3 | Additional Liquids with New Stream m3 | Liquids Allocated to New Stream with Proposed New Method (DANGL) m3 | Liquids Allocation Difference m3 | % |
|---|---|---|---|---|---|---|
| C3 (Propane) | 1,717.2 | 1,876.8 | 159.6 | 160.0 | 0.4 | 0.0 |
| C4 (Butane) | 2012.9 | 2,164.7 | 151.8 | 151.7 | -0.1 | 0.0 |
| C5+ (Pentane+) | 1983.0 | 2,110.3 | 127.3 | 127.2 | -0.1 | 0.0 |

Fig. 7

| Compound | Stream 1 Composition (mole fraction) | Stream 2 Composition (mole fraction) | Stream 3 Composition (mole fraction) |
|---|---|---|---|
| NITROGEN | 0.0178 | 0.0158 | 0.0097 |
| CARBON DIOXIDE | 0.0030 | 0.0049 | 0.0051 |
| HYDROGEN SULFIDE | 0.0000 | 0.0000 | 0.0000 |
| HELIUM-4 | 0.0002 | 0.0004 | 0.0004 |
| METHANE | 0.8744 | 0.8276 | 0.7224 |
| ETHANE | 0.0552 | 0.0719 | 0.1166 |
| PROPANE | 0.0293 | 0.0393 | 0.0737 |
| ISOBUTANE | 0.0050 | 0.0098 | 0.0161 |
| n-BUTANE | 0.0060 | 0.0119 | 0.0283 |
| ISOPENTANE | 0.0023 | 0.0046 | 0.0088 |
| PENTANE | 0.0019 | 0.0038 | 0.0085 |
| HEXANE | 0.0020 | 0.0039 | 0.0059 |
| HEPTANE | 0.0014 | 0.0028 | 0.0028 |
| OCTANE | 0.0011 | 0.0021 | 0.0012 |
| NONANE | 0.0003 | 0.0006 | 0.0003 |
| DECANE | 0.0001 | 0.0003 | 0.0001 |
| CARBON MONOXIDE | 0.0000 | 0.0000 | 0.0000 |
| HYDROGEN | 0.0001 | 0.0003 | 0.0001 |

Fig. 8

| | $\frac{\partial F_i}{\partial q_1}$ | $\frac{\partial F_i}{\partial q_2}$ | $\frac{\partial F_i}{\partial q_3}$ | $\frac{\partial F_i}{\partial q_1} \cdot q_1$ | $\frac{\partial F_i}{\partial q_2} \cdot q_2$ | $\frac{\partial F_i}{\partial q_3} \cdot q_3$ | $\sum_{j=1}^{3} \frac{\partial F_i}{\partial q_j} \cdot q_j$ | | $F_i$ from Model |
|---|---|---|---|---|---|---|---|---|---|
| | (m³/d)/(Mm³/d) | | | (m³/month) | | | (m³/month) | | (m³/month) |
| C3 | 1.01 | 2.37 | 4.01 | 100.93 | 237.08 | 400.67 | 738.68 | <---> | 738.72 |
| iC4 | 0.20 | 0.84 | 1.94 | 19.90 | 83.89 | 193.77 | 297.55 | <---> | 297.41 |
| nC4 | 0.25 | 1.06 | 3.30 | 25.16 | 105.98 | 330.49 | 461.63 | <---> | 461.29 |
| iC5 | 0.23 | 0.57 | 1.26 | 22.69 | 57.48 | 126.22 | 206.39 | <---> | 206.41 |
| nC5 | 0.19 | 0.48 | 1.21 | 19.33 | 48.07 | 120.57 | 187.97 | <---> | 187.97 |
| C6 | 0.29 | 0.62 | 0.97 | 29.44 | 61.67 | 96.73 | 187.84 | <---> | 187.86 |
| C7 | 0.25 | 0.51 | 0.52 | 25.05 | 50.82 | 51.60 | 127.48 | <---> | 127.49 |
| C8 | 0.21 | 0.43 | 0.25 | 21.31 | 42.81 | 24.64 | 88.77 | <---> | 88.77 |
| C9 | 0.07 | 0.13 | 0.07 | 6.72 | 13.46 | 6.75 | 26.93 | <---> | 26.94 |
| C10 | 0.04 | 0.07 | 0.02 | 3.67 | 7.35 | 2.45 | 13.47 | <---> | 13.47 |

| | Method of the Invention | | | Standard Method | | |
|---|---|---|---|---|---|---|
| | Stream 1 | Stream 2 | Stream 3 | Stream 1 | Stream 2 | Stream 3 |
| | Gas GJ/month | | | Gas GJ/month | | |
| | 118,578 | 115,702 | 116,445 | 115,026 | 115,685 | 120,014 |
| | Liquids m3 / month | | | Liquids m3 / month | | |
| Propane | 100.9 | 237.1 | 400.7 | 152.0 | 204.1 | 382.7 |
| Butane | 45.0 | 189.8 | 523.9 | 107.6 | 213.3 | 437.8 |
| Pentanes + | 128.2 | 281.7 | 429.0 | 143.9 | 287.8 | 407.2 |

DIFFERENTIAL METHOD FOR EQUITABLE ALLOCATION OF HYDROCARBON COMPONENT YIELDS USING PHASE BEHAVIOR PROCESS MODELS

FIELD OF THE INVENTION

The present invention relates generally to hydrocarbon accounting methods for tracking hydrocarbon production from commingled source streams. And, more particularly, relating to a differential method of allocating components of a hydrocarbon product to components of separate source streams that are commingled as a single source stream.

BACKGROUND OF THE INVENTION

Oil and gas (hydrocarbon) processing facilities commonly combine raw materials from multiple sources into one commingled stream which serves as the inlet stream for the production system. As the commingled stream proceeds through the production system, it is subjected to various process operations. The amount of each type of output product produced from the commingled stream depends not only on the composition of the commingled stream but also on process operations performed and the pressure and temperature conditions during the operations.

Source streams from various owners will often be combined to form the inlet stream that enters the hydrocarbon processing facility. The standard Production Accounting (PA) method of allocating the output products from processing facilities back to source streams is the Inlet Ratio (IR) method, although some variations of the IR method are also used. The IR method assigns output components from processing in proportion to the individual stream rate and compositional content. The IR method uses the source stream composition and rate of flow to arrive at the proportion of an individual liquid component volume or amount from the processing facility to be assigned to that source stream. If $F_i$ is the saleable quantity of component "i" produced from a processing facility, then the method is described by $$F_i = \Sigma_{j=1}^{n} q_j \cdot c_{ij}$$

where $q_j$ is the quantity of the inlet stream "j" of n streams and $c_{ij}$ is the fraction of component "i" in the inlet stream "j". If $F_{ij}$ is the allocation of the component i to stream j, then the allocation is simply:

$$\frac{F_{ij}}{F_i} = \frac{q_j \cdot c_{ij}}{\sum_{j=1}^{n} q_j \cdot c_{ij}}$$

While the methods heretofore fulfill their respective, particular objectives and requirements, they do not provide an equitable distribution of the actual output product. As such there exists a need for a method of equitably distributing the actual output product, which substantially departs from the prior art, and in doing so provides a method primarily developed for the purpose of equitably distributing the actual output product.

SUMMARY OF THE INVENTION

In view of the foregoing disadvantages inherent in known methods for allocating hydrocarbon component yields, embodiments of the present invention provide a new method for allocating hydrocarbon component yields that equitably allocates produced product to specific raw sources that contributed to the produced product.

Embodiments of the present invention also provide a method for allocating hydrocarbon component yields that accounts for variations in product output resulting from inlet stream composition, production process, and process stream conditions.

In general, in one aspect, a method for equitable allocation of hydrocarbon product component yields is provided. The method includes determining a source stream composition for each of at least two source streams; producing an actual output stream amount for each of at least two output streams by processing the source streams as a single commingled inlet stream; calculating a simulated output stream amount for each of at least two output streams through simulation of the processing of the source streams through production processes as a simulated single commingled inlet stream; calculating a total actual output stream amount; calculating a total simulated output stream amount; prorating said total simulated output stream amount to the total actual output stream amount to determine a prorated simulated output stream amount; allocating a percentage of the prorated simulated output stream amount for each of the source streams, wherein allocating a percentage of the prorated simulated output stream amount for each of the source streams comprises, (a) varying an amount of one of the source streams by an incremental amount to create a modified commingled inlet stream, (b) calculating a modified simulated output stream amount for each of the output streams through simulation of the processing of the modified single commingled inlet stream, repeating steps (a) and (b) until each amount has been modified for each of the source streams, (d) generating an differential value table by storing the change to the simulated output streams resulting from each change to an amount of one of the source streams, (e) determining the allocation of the total actual output stream amount to each of the source streams by referencing the differential value table.

In general, in one aspect, a method for equitable allocation of hydrocarbon product component yields is provided. The method includes allocating a percentage of at least two simulated output streams to each of at least two source streams, wherein allocating a percentage of said simulated output streams to each of said at least two source streams comprises, (a) varying an amount of one of said at least two source streams by an incremental amount to create a modified commingled inlet stream; (b) calculating a modified simulated output stream amount for each of said at least two output streams through simulation of the processing of the modified single commingled inlet stream through use of process modeling software; (c) repeating steps a and b until each desired amount has been modified for each required source stream from said at least two source streams; and (d) generating a differential value table by storing the change to said simulated output streams resulting from each change to an amount of one of said at least two source streams.

There has thus been outlined, rather broadly, the more important features of the invention in order that the detailed description thereof that follows may be better understood and in order that the present contribution to the art may be better appreciated.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

For a better understanding of the invention, its operating advantages and the specific objects attained by its uses, reference should be had to the accompanying drawings and descriptive matter in which there are illustrated embodiments of the invention.

BRIEF DESCRIPTION OF THE DRAWINGS

The following drawings illustrate by way of example and are included to provide further understanding of the invention for the purpose of illustrative discussion of the embodiments of the invention. No attempt is made to show system details of the embodiments in more detail than is necessary for a fundamental understanding of the invention, the description taken with the drawings making apparent to those skilled in the art how the several forms of the invention may be embodied in practice. Identical reference numerals do not necessarily indicate an identical feature. Rather, the same reference numeral may be used to indicate a similar feature or a feature with similar functionality. In the drawings:

FIG. 2 is a chart showing the composition of exemplary inlet streams;

FIG. 3 is a chart showing exemplary liquid yields;

FIG. 7 is a chart showing exemplary allocations of output streams;

FIG. 8 is a chart showing the source stream compositions for Example 1;

FIG. 9 is a chart showing the differential terms, sum, and comparison to liquid component output directly from simulation for Example 1; and FIG. 10 is a chart showing the allocation results for Example 1.

DETAILED DESCRIPTION OF THE INVENTION

With reference to FIGS. 1 through 10, a new method for allocating components of a hydrocarbon product to components of separate source streams that are commingled as a single source stream, in accordance with embodiments of the present invention will be described. First, the hydrocarbon production process and process modeling (PM) will be described as this is the arena in which the method of the present invention may be performed. Following the description of the hydrocarbon production process and PM, the method of the present invention will be described.

Figure 1:
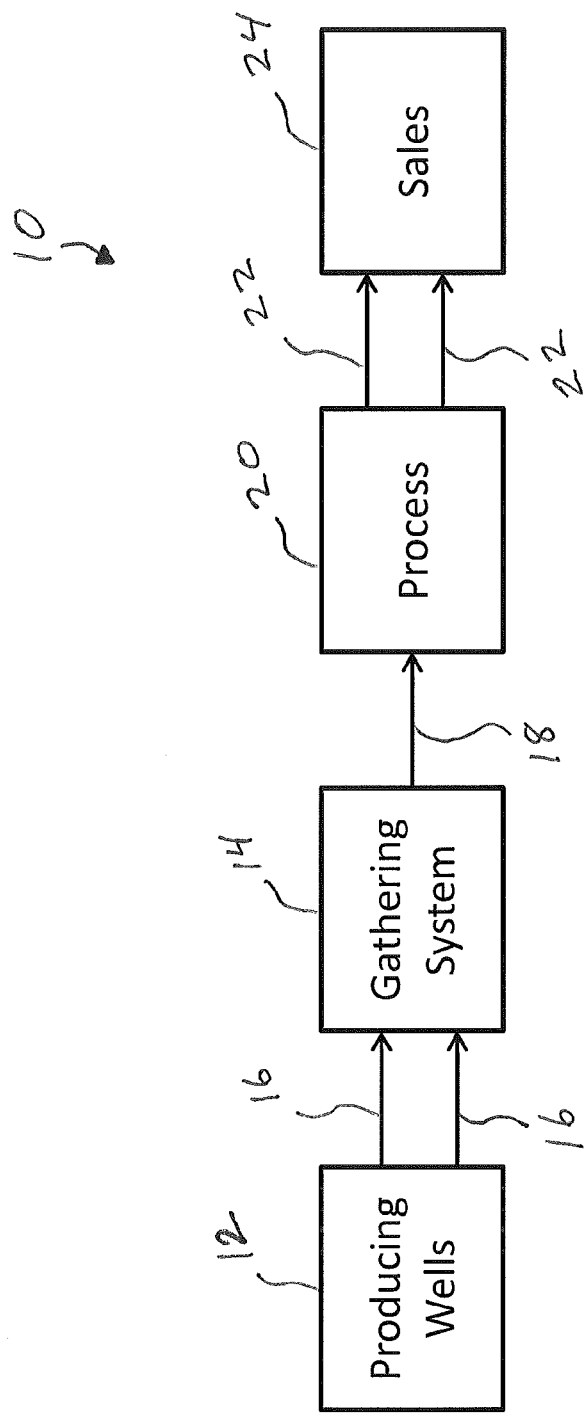
FIG. 1 is a schematic view illustrating a generic hydrocarbon production cycle from well production to sales.

Now with reference to FIGS. 1-3, the hydrocarbon production process and PM will be described. With particular reference to FIG. 1, there is shown a schematic view illustrating a generic hydrocarbon production cycle 10 taken from well production to sales. The input hydrocarbon material to be processed is first removed from the producing wells 12 and transferred to a gathering system 14. The gathering system 14 joins together at least two, but often many, source streams 16 of material from the producing wells 12 into a single commingled input stream 18. The comingle input stream 18, will commonly be comprised of as much as 3, 5, 7, 9, 15, 25, 50 or more source streams. From the gathering system 14, the commingled stream 18 enters a hydrocarbon processing system 20 where it undergoes various processing to produce at least two, but often many, output streams 22. The output streams 22 then proceed to separate containment or sales areas 24 depending on the type of product and how that product is owned.

The various steps of the hydrocarbon production cycle 10, and the "trip" taken by each component involved in the hydrocarbon production cycle 10, can be described through PM. PM involves the use of a process simulator to describe the hydrocarbon production cycle 10, using proper thermodynamic calculations. Knowing the composition, pressure, and temperature allows the relative splits of gas and liquid and their corresponding compositions to be determined. This is a sophisticated, highly accurate method of detailing the production-to-sales journey that makes up the hydrocarbon production cycle 10.

There is a selection of process simulators commercially available including HYSYS by AspenTech and VMGSim by Virtual Materials Group. These use equation of state thermodynamic flash calculations that determine, for a given composition, pressure, and temperature, the quantities and compositions of the phases (gas or liquid) at each point in a production process.

Unlike a typical PA software package, PM can closely quantify the content and amount of gas and liquid streams at any point in the hydrocarbon production cycle 10, most importantly at the sales area 24 for balancing purposes. The IR method refers to no stated equitable allocation principle; it is simply a proration of sales products in the output streams 22 based purely on individual source stream 16 composition without reference to what the individual streams actually contribute to the distribution of the liquids and gaseous products, which have inherently different value. The output production 22 from a hydrocarbon processing system 20 depends on more than just the chemical composition of the commingled inlet stream 18. The operations performed and the conditions under which those operations are performed can greatly vary the output production 22 from what would be achieved if each source stream 16 were to be processed individually.

A PM model is capable of including the exact composition of each individual source stream 16 as well as the conditions (such as temperature and pressure) under which the source stream 16 enters the gathering system 14. The PM model will preferably combine the individual source streams 16 into a single commingled stream 18 for processing. The term commingled as used in the description must be understood to mean that at some point between the individual source streams 16 and the output streams 22, the various source streams will be fed into the same system. This can happen at one location as described above or the source streams 16 or portions thereof may be interjected into the processing system 20 at various points. The PM model may optionally interject various portions of the individual source streams 16 at various stages in the processing system 20 to gradually commingle the source streams 16. The PM model may also include variations of commingled and interjected streams in order to properly match the actual production system 20 used.

The difference between the allocation result of the IR method and the result from PM can be seen through the use of an example of natural gas processing, more specifically a case where a new source stream is tied-in to an existing gas processing facility having multiple source streams 16 and multiple output streams 22. The new source stream 16 and the pre-existing commingled input stream 18 compositions for this example are shown in FIG. 2. If the existing inlet stream rate is 900,000 standard cubic meters per day (900 E3m3/day) and the new source stream rate is 30,000 standard cubic meters per day (30 E3m3/day), PM gives the results shown in FIG. 3.

The standard method of allocation (IR) greatly reduces the liquids component volumes or amounts allocated to the new source stream that are directly attributable to the addition of the new source stream in this example. The reduction is due to the simplistic application of the inlet stream compositions to allocated liquids, without regard to the phase behavior effect inherent in the gas processing operation that produces the liquids.

The problem is that the equation used in the IR method is not correct. In the example above for Propane, the ratio of additional to total propane liquid, which should be very close to the equitable allocation ratio, is:

$$\frac{F_{ij}}{F_i} \approx \frac{159.6}{1,876.8} = 0.0850$$

But the IR method provides an allocation ratio of:

$$\frac{q_j \cdot c_{ij}}{\sum_{j=1}^{n} q_j \cdot c_{ij}} = \frac{30 \times 0.0737}{(30 \times 0.0737) + (900 \times 0.0393)} = 0.0588$$

It is important to understand that all the different features of a commingled input stream 18 have an influence on the specific liquid yield in terms of volume and composition. The processing system 20 is not processing each individual source stream 16 in isolation, so the actual yield differs from what would result if such individual source stream 16 processing could occur. Therefore, for equitable distribution of the valuable output products 22, the allocation context must be the commingled input stream 18, not a theoretical construct of liquid yields from single source streams 16. The allocation context must also not be a theoretical construct where there are large changes to the commingled input stream, for example, by the complete or substantial removal of any individual source stream.

Figure 4:
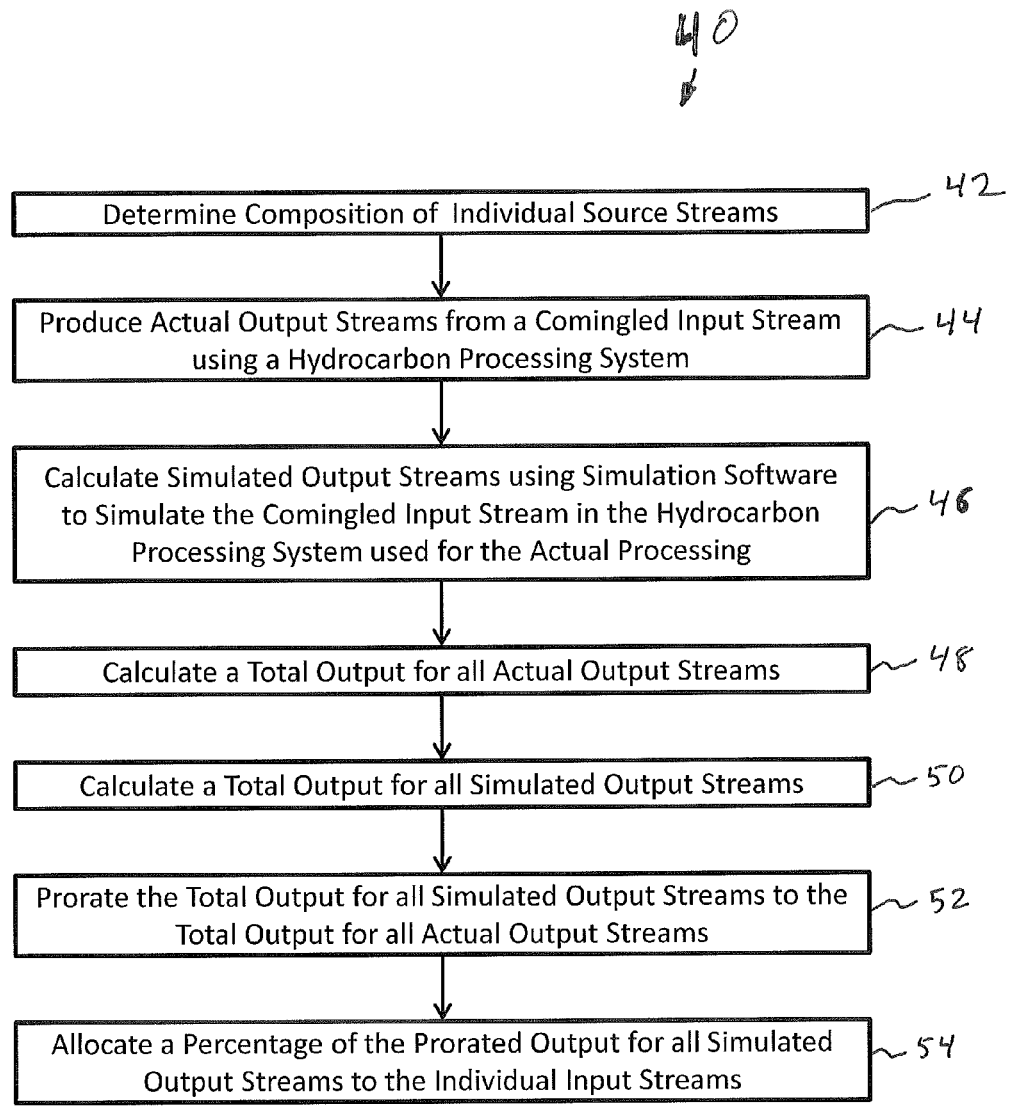
FIG. 4 is a flow chart illustrating the steps of the allocation method of the present invention.
Figure 5:
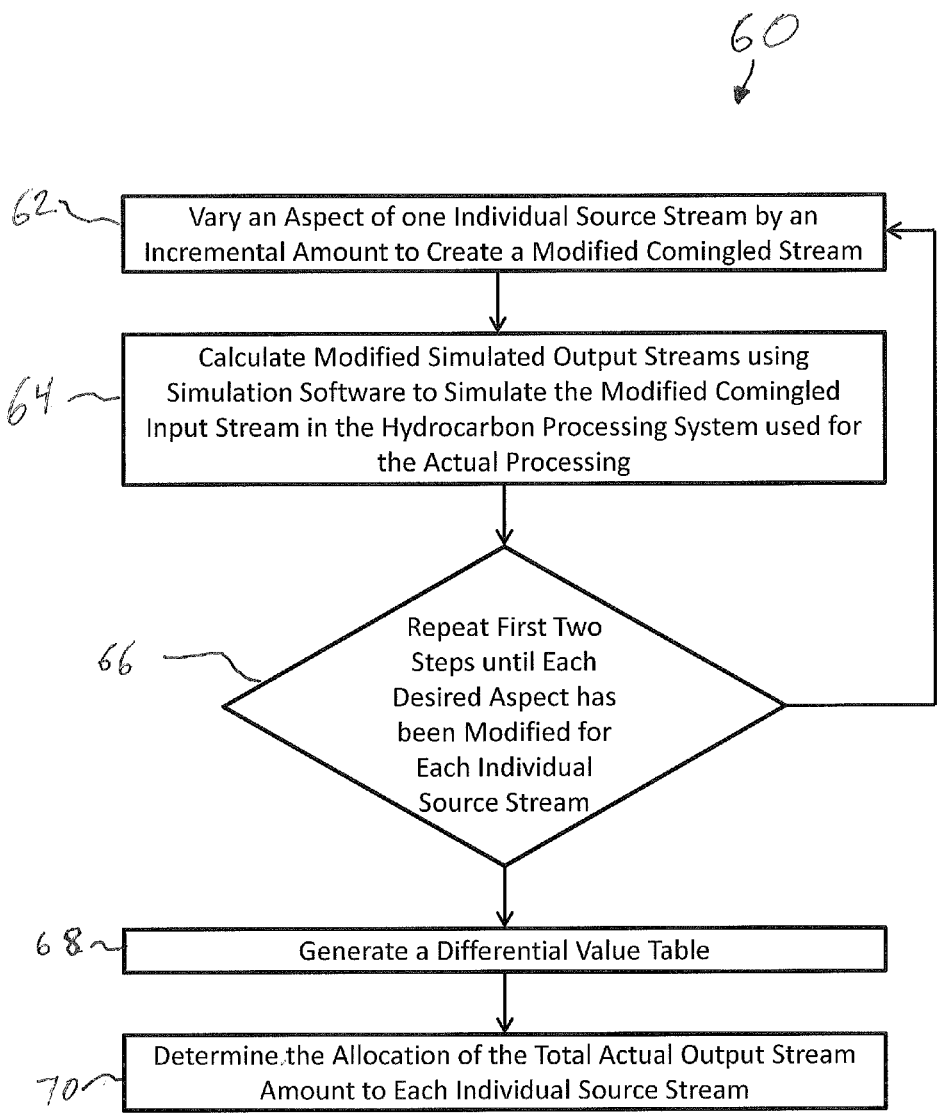
FIG. 5 is a flow illustrating the generation and use of a differential value table.

Now with particular reference to FIGS. 4 and 5, the allocation method of the present invention will be described. With reference to FIGS. 4 and 5, there is illustrated a process flow chart 40 embodying principals allocation method and the manner in which it can be applied to the hydrocarbon production system 10. The process of determining the allocation of the value of components in the output streams 24 to individual source streams 16 will be described in relation to process flow chart 40.

The allocation method of the present invention is based on the premise that incremental volume or amount of a component of an output stream 22 due to an increment in an individual source stream 16 volume or amount reflects the contribution of the source stream 16 for that component. For this reason, a user must determine the composition of the individual source streams 16, at step 42. A user must also produce actual output streams from a commingled input stream using a hydrocarbon processing system, at step 44. A user will further be required to calculate simulated output streams using simulation software to simulate the commingled input stream in the hydrocarbon processing system used for the actual processing, at step 46. There will always be some small amount of difference between actual output stream and simulated output stream due to measurement uncertainties.

The method of allocation of the present invention relies on the use of small changes to source streams 16 to determine the sensitivity of the quantity sales products (output streams 22) to these changes. With small changes, the integrity of the commingled source stream required to accurately describe the process is preserved. This method of allocation therefore allows the assignment of proper credit for each of these quantity sales products (output streams 22) to the individual source streams 16. The incremental (or differential) stream contribution defines the allocation of components to that source stream 16.

The allocation method of the present invention is described mathematically below which employs the syntax and logic of differential calculus. The entire modeled process can be described by a mathematical function F. The mathematical explanation is described in the context of a natural gas processing system, which may be referred to as Differential Allocation of Natural Gas Liquids (DANGL). It should be understood that although the context of a natural gas processing system is used for the purposes of explanation, the allocation method of the present invention may be applied to any hydrocarbon processing system 10.

The liquid volume or amount for each component, for a given source stream 16 and process 20, must be a function of only individual source stream 16 contributions. This means that each of the $F_i$ terms can be considered as an (n+1) dimensional surface. However, the allocation method of the present invention only requires a solution for $F_i$ at a single point defined by $$F_i = f(q_1, q_2, \ldots, q_n).$$

The liquid volume of a given component may be very generally stated as $$F_i = \sum_{j=1}^{n} a_{ij} \cdot q_j$$

where the $a_{ij}$ terms are unique coefficients that depend on the volume rate and compositions of the individual source stream and the total inlet stream and on the process to which the gas is subjected. For a given process (e.g. a refrigeration facility operated in a given way), the resulting quantities (for natural gas processing—liquids volumes) are uniquely determined by the overall composition and volume of the inlet stream. The coefficients $a_{ij}$ therefore may be considered constants for a given inlet stream and process. This "uniqueness" assumption is appropriate for an allocation that is allowed to change for each stable operating or allocation period.

The principal of the allocation method of the present invention that incremental volume of a produced liquids component due to an increment in an individual source stream volume reflects the contribution of the source stream for that component may be stated mathematically as:

$$F_i = \sum_{j=1}^{n} \frac{\partial Fi}{\partial q_j} \cdot q_j$$

Because the liquid volume for each component, for a given source stream and process, must be a function of only individual source stream contributions, each of the $F_i$ team can be considered as an (n+1) dimensional surface. However, because the allocation method only requires a solution for $F_i$ at a single point, the constant coefficients of allocation are determined to be:

$$a_{ij} = \frac{\partial Fi}{\partial q_j}$$

and $$F_{ij} = \frac{\partial Fi}{\partial q_j} \cdot q_j$$

which is referred to as the allocation statement.

The allocation method of the present invention allows a user to determine the allocation coefficients $a_{ij}$ by determining the changes in $F_i$ that result from small changes or deviations in $q_j$, at step 54. The deviations will in $q_j$ generally be less than 20%. The deviations in $q_j$ will preferably be less than 10%. The deviations in $q_j$ will more preferably be less than 6%. The large amount of deviations in $q_j$ is not practically possible physically, but it is easily done with PM that employs the relevant stream composition and operational parameters. Small relative changes in each individual inlet streams are made, one at a time, and the PM run for each change, at steps 62 and 66, in flow chart 60. The PM calculates the output of the modified commingled input stream in the hydrocarbon processing system used for the actual processing, at step 64. From the results of the PM, a table of $$\Delta F_i/\Delta q_j$$

values, called the differential value table, is generated, at step 68, to be used as the equivalent of the $$\frac{\partial Fi}{\partial q_j}$$

terms.

The differential value table is created for a relevant reporting period (monthly for example) or for each period that differs in significant operational parameters or inlet composition and rate. The model is run in "steady-state" mode since this is what the input data typically support. The use of "steady-state" mode provides results well within practical measurement uncertainties. The differential value table can be prepared for multiple steady-state periods that may be required due to operational or process stream changes, and may approach full dynamic simulation with a sufficient number of appropriate differential inputs.

The differential value table is derived from values determined using PM is an extremely valuable advantage of the method of the present invention. Others have proposed the use of PM to determine the equitable allocation of output product value to the appropriate source stream, however the previous methods do not employ a small differential method which is required to prove equitable allocation that employs a model that is as close to an actual process as possible.

The method of the present invention also requires rules for handling negative differentials that is, when $$a_{ij} = \frac{\partial Fi}{\partial q_j} < 0$$

This can occur in situations where individual source streams differ considerably in composition. One example is when a leaner (less rich in C2+ components) source stream is part of an inlet stream to a natural gas processing facility. The "lean gas effect" reduces liquids component output in typical refrigeration plant operations.

Figure 6:
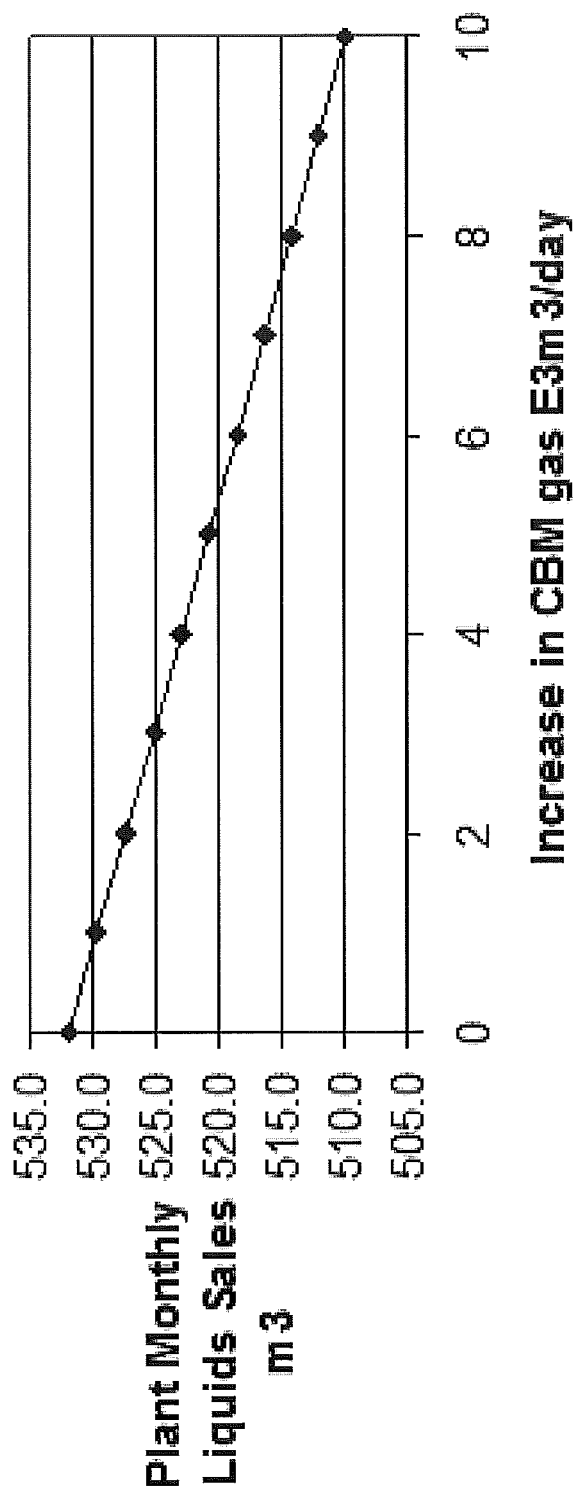
FIG. 6 is chart showing the effect of increasing lean gas into an inlet stream with richer production gases.

FIG. 6 shows that the effect of increasing lean gas into an inlet stream with richer production gases in a typical refrigeration plant situation can be a decrease liquids output. In the standard PA method of allocation, some liquids would be allocated to the leaner streams, even though their existence decreases liquids for many components. With the method of the present invention, the liquids would be modeled correctly with a proper simulation of the processing operation. The default allocation method should be to not allocate any liquids of a component for a stream where there is a negative differential. Therefore, if the incremental quantity of a produced component due to an increment in an individual source stream volume is negative, that source stream's allocation of the component should be zero. The component should be allocated to the streams producing positive increments in proportion to their contributions.

Although the effect of various stream compositions in different processing situations is infinite, the specific effects on product component yield are calculable for a given situation with the method of the present invention. In the absence of any unique business arrangements, allocation should reference a total source stream effect on component yield. In the lean gas example, although this production stream might contain some components that are associated with liquids, its effect as part of the commingled inlet stream is what is relevant. Even if a gas would produce some liquids if it were put through the plant alone or as part of some other theoretical production scenario, that is not the relevant situation. The converse is true of a richer stream, more liquids would be produced if only that richer stream (or as part of a stream without lean gas) was processed through the facility. However, there is no recourse for richer stream owners in the standard PA enviromnent. Reducing the richer source stream liquid allocation further by allocating some liquids to a lean source stream compounds the inequity in liquid allocation.

In the specific case of natural gas processing, the model liquids output from the PM are prorated to the actual liquids output sales from the plant, at step 52. The PM values for the total output, at step 50, and the actual total output, at step 48, always differ to some minor extent due to combined measurement uncertainties. However, the differences between the product volumes or amounts calculated directly with the model compared to those derived from using the allocation factors and the differential value table should be small.

The liquids output is allocated, component by component, according to the allocation statement, at step 70. With the liquid allocations completed, the gas sales stream can be allocated to the individual source streams in a standard manner. The gas allocation is in proportion to the heating value of each source stream after adjustment for the heating value of the liquids allocated to each source stream, and net of plant fuel allocated to each source stream. The technique is illustrated in flow chart form in FIG. 5.

In the example used to explain the method of the present invention (incorporating FIGS. 2 and 3), a comparison of the allocation using PM results directly and using the differential value table is shown in FIG. 7. The results show that the method of the present invention provides an equitable allocation of liquids to the new source stream. This is in distinct contrast to the IR method results in FIG. 3.

In practice, the updating of the PM may not be required or practical for each reporting period. This would be justified in the situation where inlet streams are similar month to month. In this case, the basic allocations could be done using "legacy" or previously calculated allocation coefficients. This would require some sensitivity testing to establish the validity of the range of applicability of using the same coefficients month to month.

EXAMPLE 1

A three source stream example is used to illustrate the method of the present invention. The method has been implemented using a VMGSim Process Model as operated with an allocation module front end. Using the method of the present invention, allocation coefficients were determined for the source streams listed in FIG. 8 that comprised the commingled inlet stream to a small refrigeration facility. Each stream provided 100 E3m3 per day of gas.

The differential terms, summation totals and comparison to liquids directly from Model are shown in FIG. 9. A deviation of 5% of each inlet stream was used to calculate the differentials in the example. The summation terms match very closely with the $F_i$ directly from the model. The detailed allocation is shown in FIG. 10 and compared to the standard method. From this example, the differences between the standard IR allocation method and the method of the present invention are clear. It is clear that the product results derived from the model directly (last column FIG. 9) compare very closely with the invention's allocation calculation (second to last column FIG. 9).

In an embodiment, wherein a portion of the actual output stream amount is comprised of gases, a portion of the gages are removed from the actual output stream amount for use within the hydrocarbon processing system before determining the allocation of the total actual output stream amount to each of the at least two source streams by referencing the differential value table.

A number of embodiments of the present invention have been described. Nevertheless, it will be understood that various modifications may be made without departing from the spirit and scope of the invention. Accordingly, other embodiments are within the scope of the following claims.

What is claimed is:

1. A method for equitable allocation of hydrocarbon component yields, comprising:
   determining a source stream composition for each of at least two source streams;
   producing an actual output stream amount for each of at least two output streams by processing said at least two source streams as a single commingled inlet stream in a hydrocarbon processing system;
   calculating a simulated output stream amount for each of at least two output streams through simulation of the processing of the at least two source streams through production processes as a simulated single commingled inlet stream by using simulation software;
   calculating a total actual output stream amount;
   calculating a total simulated output stream amount;
   prorating said total simulated output stream amount to said total actual output stream amount to determine a prorated simulated output stream amount;
   allocating a percentage of said prorated simulated output stream amount to each of said at least two source streams, wherein allocating a percentage of said prorated simulated output stream amount to each of said at least two source streams comprises,
   a. varying an amount of one of said at least two source streams by an incremental amount to create a modified commingled inlet stream;
   b. calculating a modified simulated output stream amount for each of at least two output streams through simulation of the processing of the modified single commingled inlet stream;
   c. repeating steps a and b until each amount has been modified for each of said at least two source streams;
   d. generating a differential value table by storing the change to the simulated output streams resulting from each change to an amount of one of said at least two source streams;
   e. determining the allocation of said total actual output stream amount to each of said at least two source streams by referencing said differential value table.

2. The method of claim 1, wherein the incremental amount is less than 20% of said amount of one of said at least two source streams.

3. The method of claim 1, wherein the incremental amount is less than 10% of said amount of one of said at least two source streams.

4. The method of claim 1, wherein the incremental amount is less than 6% of said amount of one of said at least two source streams.

5. The method of claim 1, wherein a portion of said actual output stream amount is comprised of gases and wherein a portion of said gases are removed from the actual output stream amount for use within said hydrocarbon processing system before determining the allocation of said total actual output stream amount to each of said at least two source streams by referencing said differential value table.

6. The method of claim 1, wherein gaseous output streams are allocated according to a heating value for each of said at least two source streams adjusted for a heating value of liquids allocated to each of said at least two source streams.

7. The method of claim 1, wherein said at least two source streams comprises at least 3 streams.

8. The method of claim 1, wherein said at least two source streams comprises at least 5 streams.

9. The method of claim 1, wherein said at least two source streams comprises at least 7 streams.

10. The method of claim 1, wherein said at least two source streams comprises at least 9 streams.

11. The method of claim 1, wherein said at least two source streams comprises at least 5 streams.

12. The method of claim 1, wherein said at least two source streams comprises at least 7 streams.

* * * * *